United States Patent [19]
Hills

[11] Patent Number: 5,913,148
[45] Date of Patent: Jun. 15, 1999

[54] REDUCED SIZE ETCHING METHOD FOR INTEGRATED CIRCUITS

[75] Inventor: Graham William Hills, San Jose, Calif.

[73] Assignee: Lucent Technologies Inc, Murray Hill, N.J.

[21] Appl. No.: 08/490,375

[22] Filed: Jun. 14, 1995

Related U.S. Application Data

[63] Continuation of application No. 07/794,317, Nov. 14, 1991, abandoned, which is a continuation of application No. 07/569,487, Aug. 16, 1990, abandoned, which is a continuation of application No. 07/404,927, Sep. 8, 1989, abandoned.

[51] Int. Cl.[6] .................................................. H01L 21/302
[52] U.S. Cl. .......................... 438/701; 438/713; 438/736; 438/717
[58] Field of Search .................................... 438/701, 713, 438/736, 717

[56] References Cited

U.S. PATENT DOCUMENTS

| | | | |
|---|---|---|---|
| 4,439,270 | 3/1984 | Powell et al. | 156/643 |
| 4,476,623 | 10/1984 | El-Kareh | 437/63 |
| 4,487,652 | 12/1984 | Almgren | 156/643 |
| 4,534,826 | 8/1985 | Goth et al. | 156/643 |
| 4,577,395 | 3/1986 | Shibata | 29/576 C |
| 4,707,218 | 11/1987 | Giammarco et al. | 156/646 |
| 4,784,719 | 11/1988 | Schutz | 156/643 |
| 4,812,418 | 3/1989 | Pfiester et al. | 437/69 |
| 4,814,041 | 3/1989 | Auda | 156/643 |
| 4,992,136 | 2/1991 | Tachi et al. | 156/643 |

FOREIGN PATENT DOCUMENTS

| | | |
|---|---|---|
| 54-32146 | of 0000 | Japan . |
| 57-53960 | 3/1982 | Japan . |
| 0130426 | 7/1984 | Japan . |
| 60-148165 | 8/1985 | Japan . |
| 0067245 | 4/1986 | Japan . |
| 63-36547 | 2/1988 | Japan . |
| 63-40323 | 2/1988 | Japan . |
| 63-124527 | 5/1988 | Japan . |
| 1-32627 | 2/1989 | Japan . |
| 8700345 | 1/1987 | WIPO . |

OTHER PUBLICATIONS

European Search Report communication dated Jun. 28, 1991.
Hitchner, J., Polyimide Layers Having Tapered via Holes, IBM Tech. Discl. Bull., vol. 20, No. 4, Sep. 1977, p. 1384.

Primary Examiner—William Powell
Assistant Examiner—George Goudreau
Attorney, Agent, or Firm—John T. Rehberg; Scott W. McLellan; Martin G. Meder

[57] ABSTRACT

A method of semiconductor fabrication which permits the creation of openings which have dimensions smaller than what may be achieved by conventional lithography. In an illustrative processing sequence, a pattern transfer material is deposited upon another material layer. The pattern transfer material is covered with photoresist which is subsequently patterned. With the patterned photoresist as a mask, the pattern transfer material is etched with a process which creates inward sloping walls. Then the pattern transfer material is used as a mask to etch the underlying material. The inward sloping walls of the pattern transfer material permit creation of an opening in the underlying material which is smaller than the corresponding opening in the photoresist. The method may also be used to create trenches or field oxides which have dimensions smaller than those achievable by lithography.

10 Claims, 3 Drawing Sheets

REDUCED SIZE ETCHING METHOD FOR INTEGRATED CIRCUITS

This application is a continuation of application Ser. No. 07/794,317 filed on Nov. 14, 1991, now abandoned, which is a continuation application under 37 CFR 1.62 of prior application Ser. No. 07/569,487 filed Aug. 16, 1990, now abandoned, which is a continuation application of Ser. No. 07/404,927 filed Sep. 08, 1989.

TECHNICAL FIELD

This invention relates to methods for the manufacture of semiconductor integrated circuits and more particularly to methods for controlled etching of various layers employed in semiconductor fabrication.

BACKGROUND OF THE INVENTION

Typical integrated circuit manufacturing processes often involve the creation of openings in various materials by selective etching. For example, openings, termed "trenches" are often made in a substrate such as silicon to provide isolation between individual devices or to provide capacitive charge storage. Other openings, termed "vias" or "windows" or "contact holes" are often made in dielectric layers to facilitate connection between two layers of metallization or between a metallization layer and an active region of a transistor. Usually these openings are created by depositing a photoresist upon the material in which the opening is to be made. Portions of the photoresist are exposed to light. Either the exposed or the unexposed portion of the photoresist is washed away (depending upon whether a positive or negative photoresist is employed) leaving selected portions of the underlying material exposed. With the remaining resist serving as a mask, the exposed portions of the underlying material are etched through to create openings. The openings may be subsequently filled with appropriate materials. For example, if the opening is a trench, the trench may be filled with insulative material to facilitate inter-device isolation. If the trench is to be used for capacitive storage, it may be lined with one or more layers of conductive material. Vias or windows may be subsequently filled with a conductive material, for example a metal, thus providing a conductive link between two layers of metallization or between a source/drain and an overlying metallization.

In general terms, it is usually considered desirable to faithfully reproduce the patterned resist in the underlying material. Attempts to make the underlying feature size (or opening) either larger or smaller than the overlying patterned resist features have generally suffered from wafer-to-wafer or within-wafer or within-chip non-uniformities.

Processes which faithfully reproduce the patterned resist in the underlying material (with vertical walls) may be termed "zero delta" processes because there is no difference in feature width between the resist and the underlying material. Occasionally, zero delta processes are subsequently modified to create features with sloping walls. Examples of zero delta processes modified to create sloping walls are the formation of sloped vias (for improved metal step coverage) and the formation of metal runners with sloped walls (for improved dielectric coverage). However, the smallest between-feature width as well as the smallest opening in zero delta processes (even with sloped walls) is generally limited by lithography.

Those concerned with the development of semiconductor devices and processes have continually sought methods for producing openings including vias and windows and trenches with dimensions below the limits achievable by straightforward lithography.

SUMMARY OF THE INVENTION

The present invention is a non-zero delta process which permits the formation of openings with dimensions smaller than those achievable by whatever lithographic processes may be available. In the practice of the present invention, a material layer (termed a "pattern transfer material") is deposited between the underlying material into which an opening is to be etched and the overlying photoresist. Thus, the pattern transfer material is sandwiched between the material-to-be-etched and the photoresist. Next the photoresist is patterned by conventional techniques to define the opening. The pattern transfer material is then etched with a process which creates an inward sloping profile. The sloping profile serves to define an opening at the interface between the pattern transfer material and the underlying substrate. However, the dimensions of the opening defined in the pattern transfer material are smaller than the corresponding opening in the photoresist. The pattern transfer material is next used as a mask to etch the underlying material, thus creating openings which have dimensions smaller than achievable by lithography in the photoresist. The openings may be utilized in a variety of ways, for example, as windows or vias, as trenches, or even as patterns for oxide growth.

DETAILED DESCRIPTION

Figure 1:
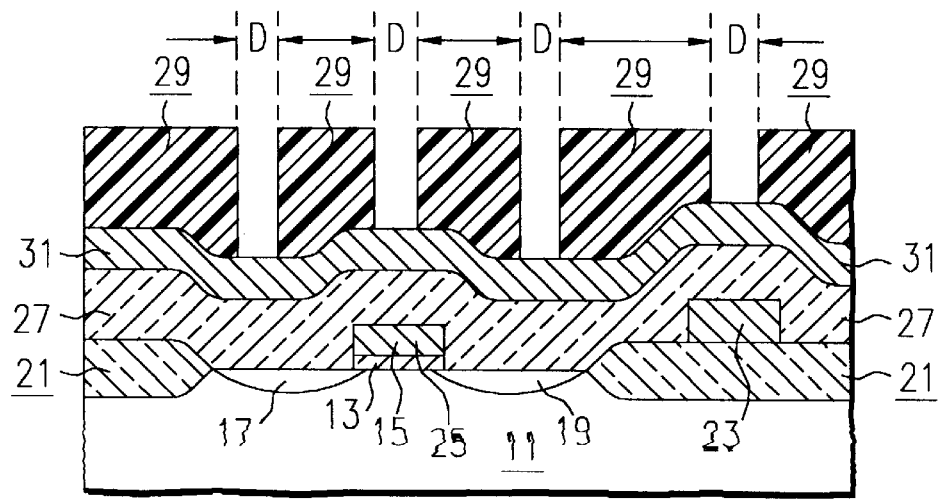
FIGS. 1, 2, and 3 are schematic cross sectional views which illustrate a method of forming devices by the present invention.

In FIG. 1 reference numeral 11 designates a substrate which may consist essentially of, for example, silicon, epitaxial silicon, gallium arsenide, or another suitable material. Reference numerals 13 and 15 designate a gate oxide and an overlying conductive material which, for example, may be polysilicon. The combination of elements 13 and 15 is often termed the "gate stack". The gate stack is designated by reference numeral 25. The invention is applicable to a variety of devices with more complex gate structures, including gates with silicide on top. A simple gate stack is shown here for convenience.

Reference numerals 17 and 19 designate a source and drain respectively. Reference numeral 21 designates a field oxide which serves to provide inter-device isolation. The invention is applicable to integrated circuit structures which use other means of inter-device isolation. Reference numeral 23 designates a gate runner which may connect two transistors.

The basic transistor structure described above is a typical MOS transistor. However, the invention may be applied to a wide variety of transistor types, including bipolar transistors. For convenience, application of the invention to MOS transistors alone will be described.

Dielectric 27 is formed over the previously described transistor structure. Dielectric 27 is often an oxide of silicon formed by chemical vapor deposition. It is assumed that it is desired to open windows or vias through dielectric 27 so that a conductive material, typically, aluminum or tungsten or polysilicon may be deposited in the windows or vias. The conductive material will be subsequently patterned to form conductive interconnections between various components.

Photoresist 29 overlies dielectric 27. It is assumed that the smallest feature width that can be lithographically printed in photoresist 29 is D. FIG. 1 illustrates patterned openings in photoresist, each with width D. A patterned opening is illustrated in FIG. 1 in photoresist 29 above each of source 17, drain 19, gate 25 and runner 23. Of course, it is not necessary for the practice of the invention that all of the above-illustrated openings be transferred to the underlying dielectric 27.

The present invention provides a method of creating openings such as windows (also termed "contact holes") in dielectric 27 which are smaller than the smallest achievable lithographic width D. The reduction in width is accomplished by depositing layer 31 (termed "pattern transfer material") on top of dielectric 27 before photoresist 29 is deposited and patterned. FIG. 1 illustrates layer 31 sandwiched between dielectric layer 27 and patterned photoresist 29.

Figure 2:
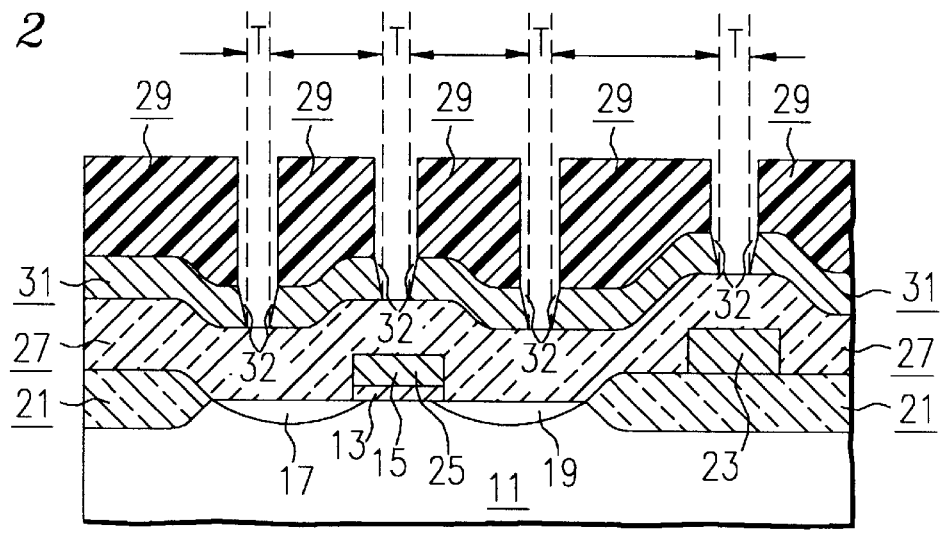

Among suitable candidate materials for pattern transfer material 27 are: polysilicon, tantalum silicide, aluminum, titanium, titanium-tungsten, and tungsten. Whatever material is employed for the pattern transfer material 31, it must be a material which can be etched to produce an inward sloping profile. (Of course, an undercut profile would not produce the desired result.) FIG. 2 illustrates the results obtained when pattern transfer material 31 is etched, using patterned photoresist 29 as a mask, to produce a sloping profile. Each of the walls 32 produced by the etch process slopes inward. It should be noted that the width of the window at the bottom of the pattern transfer material 31 has a width with dimension T which is smaller than the smallest lithographically achievable dimension, D, mentioned above. Dimension T is smaller than dimension D, because the walls 32 slope inward. Examples of etch processes which will produce the desired sloping walls 32 will be discussed in forthcoming paragraphs.

After the structure depicted in FIG. 2 is obtained, pattern transfer material 31 is used as a mask for the next etch step. In the next etch step, dielectric 27 is etched through pattern transfer material 31. Each of the windows vias created in dielectric 27 will have a width T similar to the width of the windows or vias created in pattern transfer material 31. Thus, the inventive process has created windows 34 through dielectric 27 to source 17, drain 19, gate 25 or runner 23 which have a width T, smaller than the smallest achievable lithographic dimension D.

The process described above is not a zero-delta process since the resulting etched width T is smaller than the lithographic width D. The delta of the process, or the difference between the final etched width and the lithographic width, may be defined as Δ=D−T. The delta of the inventive process may be controlled by the amount of slope created on walls 32 and by the thickness of pattern transfer material 31.

After windows or vias 34 are created, standard processing steps may be performed, including removal of the pattern transfer material 31 (if desired) and creation of the appropriate metallization scheme.

There exist a variety of etching techniques that produce sloped walls in various materials. Generally, it is believed that such etching techniques accomplish their result by the formation of a polymeric sidewall which tends to protect the side of the material under etch, creating a sloped side. However, other mechanisms may be responsible for creation of sloped sides under various circumstances (such as deposition of reaction products or feed gas species by control of the substrate temperature). One example of a suitable etch process which may be employed when the pattern transfer material is aluminum is contained in copending application entitled "Method and Apparatus for Tapered Etching" filed on Jun. 30, 1988, designated "Bredbenner-1" and assigned to the assignee of the present application, and incorporated herein by reference.

The following example illustrates application of the inventive principles:

EXAMPLE

An 8000 Å layer of undensified silicon oxide deposited by chemical vapor deposition from tetraethylorthosilane (TEOS) was deposited upon several silicon substrates. A pattern transfer material was deposited on top of the silicon oxide. In some cases the pattern transfer material was 4000 Å undoped polysilicon; in other cases, the pattern transfer material was 2500 Å tantalum silicide. The pattern transfer material was covered with 1.1 $\mu$m photoresist (HPR 204, a proprietary product of the Hunt Chemical Company).

The photoresist was patterned using a standard reticle for formation of 1.0 $\mu$m windows or elongated trenches. Then the pattern transfer material was patterned with trichlorofluoromethane at a flow of 60 sccm and at 10 $\mu$m pressure. It has been established that the addition of oxygen to this etch process reduces protective sidewall growth while increased bias or power in the etch increases sidewall growth (and therefore increases the amount of slope obtained in the pattern transfer material layer). Consequently, a high bias voltage (in the absence of oxygen) of approximately −500 V was employed to etch the polysilicon in a hexode reactor.

After the pattern transfer material layer was etched, the underlying oxide was etched using trifluoromethane and oxygen. The resulting reductions in widths of the vias or trenches in the oxide were 0.5 $\mu$m for the 4000 Å polysilicon material and 0.24 $\mu$m for the 2500 Å tantalum silicide. The amount of width reduction depended upon the thickness of the pattern transfer material, a thicker pattern transfer material producing a greater width reduction.

Some experimenters in the art have concluded that a process whose anisotropy is controlled by a sidewall protection mechanism (such as that used to etch the pattern transfer material) may be sensitive to proximity effects, i.e. variable linewidth change with respect to the local line density. For example, in the conventional etching of polysilicon gates, the linewidth of isolated gates may be slightly larger than the linewidth of closely spaced gates. However, the etching of the pattern transfer material in the present invention is expected to be less sensitive to proximity effects since windows or vias are being defined. Thus, the etching characteristics of a particular window should be little affected by adjacent windows.

The inventive technique is most effective when used with a planarized dielectric, although planarization is not necessary. The inventive technique differs from etching methods which employ tri-layer and bi-layer resists in a variety of ways, including the fact that most tri-layer and bi-layer schemes are zero-delta processes.

The present technique also provides various advantages over processes which involve etching of a dielectric to produce sloped sides in the dielectric itself. Often such processes involve a sidewall protection mechanism during the dielectric etch. However, the size of the opening at the bottom of the dielectric layer depends upon the thickness of the dielectric. The present technique produces straight sides in the underlying material and consequently the size of the opening at the bottom of the dielectric layer does not depend upon the thickness of the dielectric layer.

Figure 3:
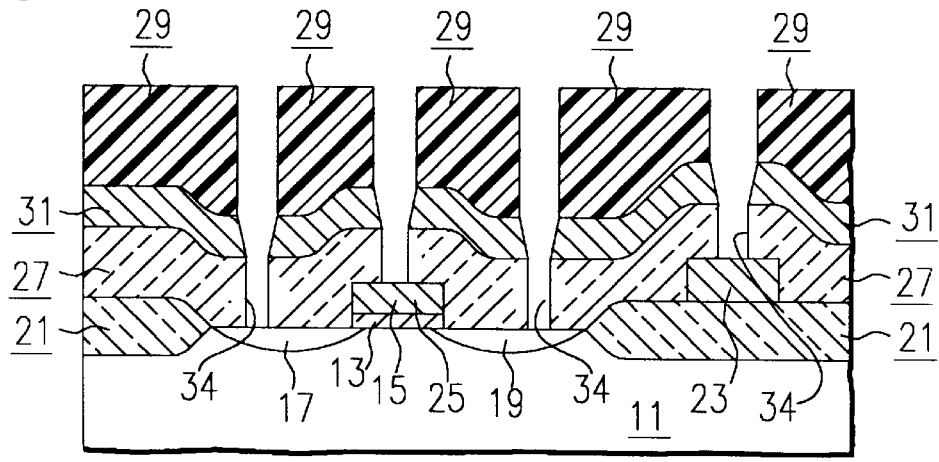

Although FIGS. 1–3 have shown the opening of windows to source, gate, drain or runner, the invention may also be applied to any part of semiconductor fabrication in which a small opening is desired. For example, the inventive process may be applied to open vias between first and second level metal or between second and third level metal or between first and third level, etc. (The term "window" is often used to designate an opening in a dielectric to permit electrical contact to a gate, source, drain, or runner. The term "via" is often used to designate an opening in a dielectric to permit electrical contact between two levels of conductive runners. The term "contact hole" is generally applicable to both windows and vias.)

The inventive technique may be applied to create other types of openings in addition to windows or vias. For example, another application of the inventive technique is illustrated in the completed structure illustrated in FIG. 4. The figure illustrates how the inventive technique can be used to create a field oxide which has dimensions that are smaller than which may be achieved by conventional lithography. Reference numeral 111 denotes a substrate which may be silicon or epitaxial silicon. Reference numeral 112 denotes a pad oxide. Reference numeral 113 is a layer of, for example, silicon nitride (such as is usually deposited during preliminary steps of wafer processing). Other layers may be substituted for oxide and nitride layers 112 and 113 respectively. Above silicon nitride layer 113 is pattern transfer material 115. Pattern transfer material 115 has a sloping side 119 which has been created by the technique discussed previously. Layers 113 and 112 have been defined using layer 115 with side 119 as the mask. After layers 115, 113 and 112 have been formed, field oxide 121 is grown by conventional techniques. Examination of the figure shows that the width of a field oxide grown without pattern transfer material 115 would be larger than the width of the field oxide 121 grown with the pattern transfer material 115 because the sloping wall 119 reduces the size of the pattern transfer material opening.

Figure 4:
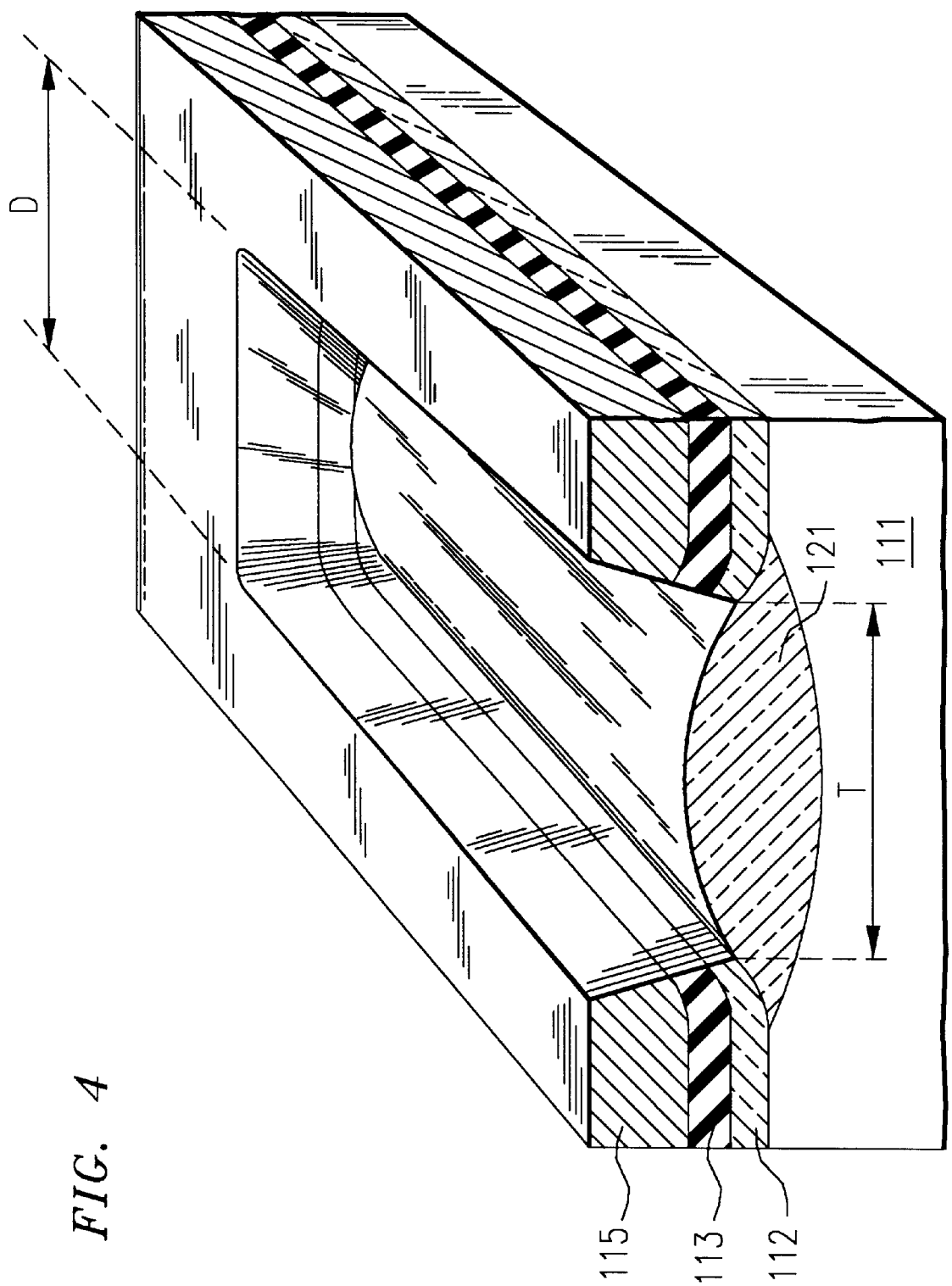
FIG. 4 is a schematic perspective view of an alternative application of the inventive idea.

The structure illustrated in FIG. 4 may also include a polysilicon buffer layer between layer 113 and pad oxide 112.

Figure 5:
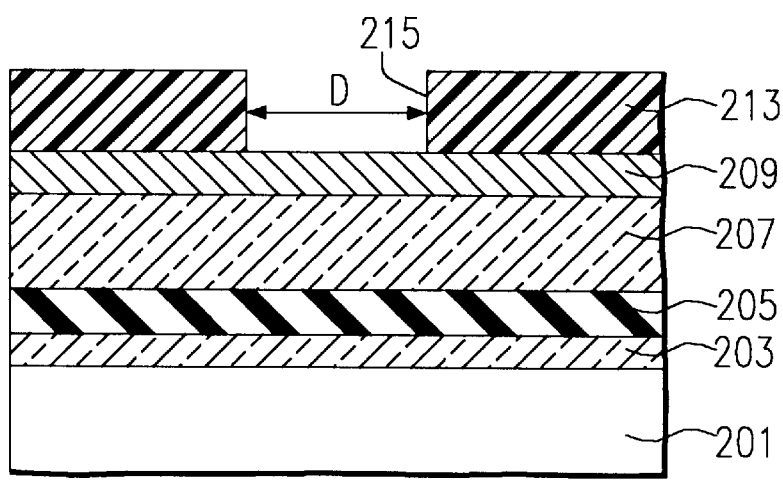
FIGS. 5–7 are additional schematic cross sectional views which further illustrate the practice of the invention.
Figure 6:
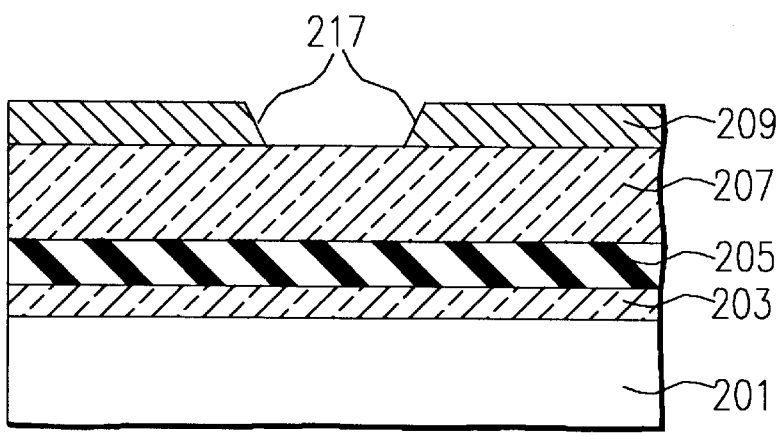
Figure 7:
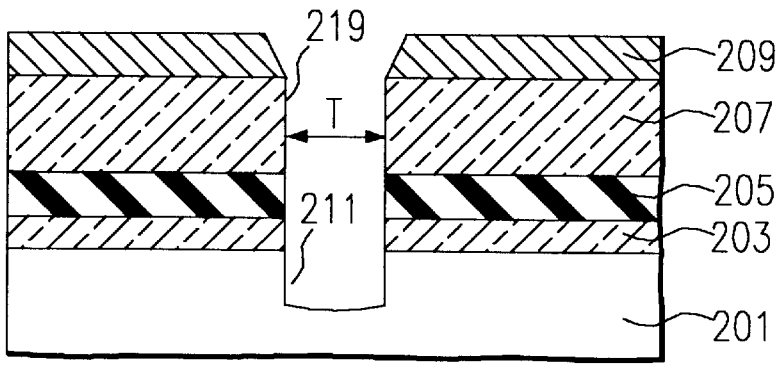

The inventive process may also be used to create trenches with small dimensions. FIGS. 5–7 illustrate a process which may be employed to create trenches with widths that are smaller than what may be expected from straightforward lithography. Turning to FIG. 5, reference numeral 201 designates a material into which a trench is to be etched. (Trench formation generally takes place before device formation.) Material 201 may typically be silicon, epitaxial silicon, etc. Reference numerals 203 and 205 designate respectively, a pad oxide and a silicon nitride layer. Layers 203 and 205 are typically formed during initial steps of silicon semiconductor processing. However, they may be omitted, or other layers substituted in their stead. Layer 207 is a thick layer of deposited silicon oxide whose function will be subsequently explained. Layer 209 is a pattern transfer material which may be chosen from among the candidates listed above. Layer 213 is a patterned resist material. An opening 215, having a width D has been created in resist 213 by conventional lithography techniques. It is desired to form a trench having a width less than D.

After resist material 213 has been patterned, pattern transfer material 209 is etched to produce inward sloping walls 217 by the techniques discussed above. Resist 213 may be stripped, if desired, resulting in the structure depicted in FIG. 6.

Oxide layer 207 is then etched using pattern transfer material 209 as a mask. As illustrated in FIG. 7, the width of the opening 219 in oxide 207 is T, which is smaller than the dimension D of the opening 215 in resist 213. After oxide layer 207 has been etched through to layer 205, it may be necessary to change etch process conditions to etch layer 205 and then layer 203. If desired, the pattern transfer layer 209 may be removed after oxide layer 207 has been etched because the narrow-width trench has been defined in oxide layer 207 and layer 207 may serve as a mask for subsequent downward etching. Finally, trench 211 may be etched into substrate 201 with oxide layer 207 serving as a mask. As mentioned before, oxide layer 207 should be comparatively thick so that it can withstand the etching procedures used to etch through layers 205, 203, and into substrate 201 without degrading.

I claim:

1. A method of semiconductor integrated fabrication comprising:

forming a first layer;

forming a second material layer, herein designated a pattern transfer material layer upon said first material layer;

forming a resist material upon said pattern transfer material layer; patterning said resist material;

etching said pattern transfer material to create at least one opening in said pattern transfer material;

etching said first material layer through said opening in said pattern transfer material to form an opening in said first material layer, CHARACTERIZED IN THAT said pattern transfer material has integral inward sloping sides, and wherein said first material layer opening has straight sides.

2. The method of claim 1 in which said first material layer is a dielectric.

3. The method of claim 1 in which said pattern transfer material is tantalum silicide and in which said pattern transfer material is etched with trichlorofluoromethane.

4. A method of semiconductor fabrication comprising:

depositing a layer of silicon dioxide;

depositing a layer of undoped polysilicon upon said layer of silicon dioxide;

depositing a photoresist upon said layer of undoped polysilicon;

patterning said photoresist to create at least one first opening;

etching said layer of undoped polysilicon with trichlorofluoromethane at a flow of approximately 60 sccm and approximately 10 $\mu$m pressure in the absence of oxygen and with a bias voltage of approximately −500 V to create inward sloping walls in said polysilicon;

using said etched polysilicon as a mask, etching said layer of silicon dioxide to create at least one second opening, said second opening being smaller than said respective first opening.

5. A method of semiconductor integrated circuit fabrication comprising:

a process for forming a field oxide, said process including forming a pattern transfer material layer overlying a substrate, said substrate having a major surface;

depositing a resist material upon said pattern transfer material;

patterning said resist material to create at least one first opening;

etching said pattern transfer material to create at least one second opening, said second opening having a smaller dimension than said first opening;

etching said substrate to form a third opening, wherein said opening has straight sides; and growing a field oxide of said substrate material, said second opening serving as a mask, said field oxide extending below said major surface of said substrate.

6. The method of claim 5 wherein said substrate is silicon.

7. A method of semiconductor integrated circuit fabrication comprising:

forming a pattern transfer material layer overlying a substrate;

forming a resist material overlying said pattern transfer material layer;

forming at least one first opening in said resist material layer, said first opening having an initial dimension and said resist material having straight sides;

etching said pattern transfer material through said first opening to create at least one respective second opening, said second opening being defined by integral inward sloping sides of said pattern transfer material, and said second opening having a respective dimension which is smaller than said corresponding initial dimension of said first opening;

etching a trench into said substrate, said pattern transfer material serving as a mask, and wherein said trench has straight sides.

8. The method of claim 7 further comprising the steps of forming at least one material layer between said pattern transfer material layer and said substrate.

9. A method of semiconductor integrated fabrication comprising:

forming a first layer;

forming a second material layer, herein designated a pattern transfer material layer upon said first material layer;

forming a resist material upon said pattern transfer material layer; patterning said resist material;

etching said pattern transfer material to create at least one opening in said pattern transfer material;

etching said first material layer through said opening in said pattern transfer material, characterized in that said pattern transfer material has integral inward sloping sides, and wherein said pattern transfer material is chosen from the group consisting of: polysilicon, tantalum silicide, aluminum, titanium, titanium-tungsten, tungsten and mixtures thereof.

10. A method of semiconductor integrated fabrication comprising:

forming a first layer;

forming a second material layer, herein designated a pattern transfer material layer upon said first material layer;

forming a resist material upon said pattern transfer material layer; patterning said resist material;

etching said pattern transfer material to create at least one opening in said pattern transfer material;

etching said first material layer through said opening in said pattern transfer material, characterized in that said pattern transfer material has integral inward sloping sides, and wherein said pattern transfer material is polysilicon, and in which said pattern transfer material is etched with trichlorofluoromethane.

* * * * *